United States Patent
Loeffler et al.

(10) Patent No.: US 7,889,589 B2
(45) Date of Patent: Feb. 15, 2011

(54) MEMORY INCLUDING PERIPHERY CIRCUITRY TO SUPPORT A PORTION OR ALL OF THE MULTIPLE BANKS OF MEMORY CELLS

(75) Inventors: Steffen Loeffler, Essex Junction, VT (US); Wolfgang Hokenmaier, Burlington, VT (US)

(73) Assignee: Qimonda AG, München (DE)

( * ) Notice: Subject to any disclaimer, the term of this patent is extended or adjusted under 35 U.S.C. 154(b) by 316 days.

(21) Appl. No.: 12/053,913

(22) Filed: Mar. 24, 2008

(65) Prior Publication Data

US 2009/0237972 A1    Sep. 24, 2009

(51) Int. Cl.
G11C 8/00    (2006.01)

(52) U.S. Cl. .............. 365/230.03; 365/185.11; 365/230.05

(58) Field of Classification Search ........... 365/230.03, 365/230.05, 185.11
See application file for complete search history.

(56) References Cited

U.S. PATENT DOCUMENTS

| 6,122,217 | A | 9/2000 | Keeth et al. |
| 6,266,735 | B1 * | 7/2001 | Isobe ........................... 711/5 |
| 6,762,948 | B2 | 7/2004 | Kyun et al. |
| 2006/0133186 | A1 * | 6/2006 | Hummler ............... 365/230.06 |
| 2008/0109627 | A1 * | 5/2008 | Toyama et al. .............. 711/167 |

* cited by examiner

Primary Examiner—Vu A Le
Assistant Examiner—Han Yang
(74) Attorney, Agent, or Firm—Coats & Bennett PPLC

(57) ABSTRACT

A memory including periphery circuitry configured to support multiple banks of memory cells. The periphery circuitry includes switches that are set to put the periphery circuitry into a first mode to support a portion of the multiple banks of memory cells and a second mode to support all of the multiple banks of memory cells.

25 Claims, 4 Drawing Sheets

US 7,889,589 B2

MEMORY INCLUDING PERIPHERY CIRCUITRY TO SUPPORT A PORTION OR ALL OF THE MULTIPLE BANKS OF MEMORY CELLS

BACKGROUND

Typically, a computer system includes a number of integrated circuit chips that communicate with one another to perform system applications. Often, the computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), low power SDRAM (LP-SDRAM), and/or pseudo static RAM (PSRAM). The controller and memory communicate with one another to perform system applications.

Some computer systems operate in mobile applications and have limited space and power resources. In mobile applications, such as cellular telephones and personal digital assistants (PDAs), memory cell density and power consumption are issues for current and future generations. Low power mobile RAM is a LP-SDRAM that has been developed for mobile applications. CellularRAM is a high performance and low power memory designed to meet memory density and bandwidth demands of current and future generations. CellularRAM is a PSRAM that offers static RAM (SRAM) pin and function compatibility, external refresh-free operation, and a low power design. CellularRAM devices are drop-in replacements for most asynchronous low power SRAMs used in mobile applications, such as cellular telephones. A PSRAM includes DRAM that provides significant advantages in density and speed over traditional SRAM.

Typically, a memory chip includes periphery circuitry and an array of memory cells. The periphery circuitry includes circuits that interface between the array of memory cells and the system controller. Often, the array of memory cells is divided into a number of banks of memory cells, such as two banks, four banks, eight banks or more banks.

The design of a memory chip in a selected process and interface technology takes many months of development. Some of this development can be reused to create memory devices in the same technology, but with different memory sizes. To create a memory chip having a different memory size, the periphery circuitry and the array of memory cells are changed schematically to adjust for the different memory size. Also, a new floor plan and significant layout effort is often needed to reshape an existing layout and optimize the memory device to a competitive integrated circuit chip size. Changing the periphery circuitry and the array of memory cells and laying out the memory chip via a new floor plan can be time consuming processes that increase the time to market and the cost of the integrated circuit chip.

For these and other reasons there is a need for the present invention.

SUMMARY

One embodiment described in the disclosure provides a memory including periphery circuitry configured to support multiple banks of memory cells. The periphery circuitry includes switches that are set to put the periphery circuitry into a first mode to support a portion of the multiple banks of memory cells and a second mode to support all of the multiple banks of memory cells.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
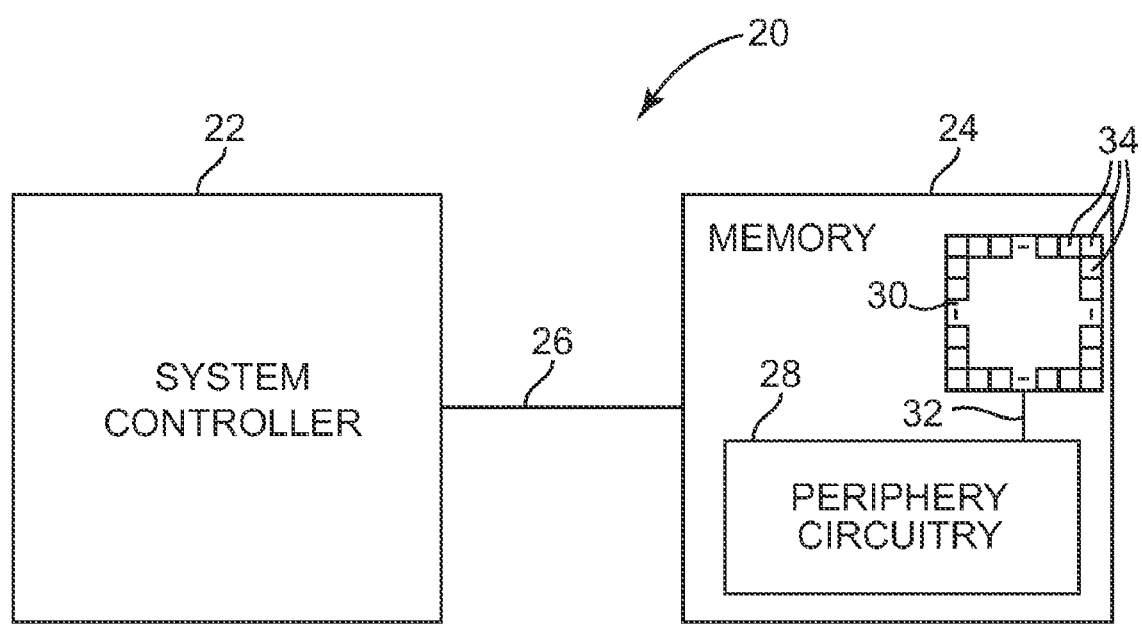
FIG. 1 is a diagram illustrating one embodiment of a computer system that includes a system controller and a memory.

FIG. 1 is a diagram illustrating one embodiment of a computer system 20 that includes a system controller 22 and a memory 24. System controller 22 is electrically coupled to memory 24 via memory communications path 26. System controller 22 and memory 24 communicate data via memory communications path 26 to perform system functions. In one embodiment, system controller 22 is a micro-processor. In one embodiment, memory 24 is a DRAM. In one embodiment, memory 24 is a LP-SDRAM. In one embodiment, memory 24 is a low power mobile RAM. In one embodiment, memory 24 is a PSRAM. In one embodiment, memory 24 is a CellularRAM. In other embodiments, memory 24 is another suitable type of memory.

Memory 24 includes periphery circuitry 28 and an array of memory cells 30. Periphery circuitry 28 is electrically coupled to the array of memory cells 30 via array signal path 32. In one embodiment, periphery circuitry 28 includes a memory controller or memory control circuit.

Periphery circuitry 28 receives addresses and commands from system controller 22 via memory communications path 26 and provides array signals. The array of memory cells 30 receives the array signals via array signal path 32 to control the array of memory cells 30. The array of memory cells 30 includes memory cells 34. In one embodiment, memory cells 34 are DRAM memory cells. In one embodiment, memory 24 is a low power mobile RAM and memory cells 34 are DRAM memory cells. In one embodiment, memory 24 is a Cellular-RAM and memory cells 34 are DRAM memory cells. In other embodiments, memory 24 is another suitable type of memory that includes suitable memory cells.

Memory cells 34 in the array of memory cells 30 are arranged into banks of memory cells. In one embodiment, the array of memory cells 30 includes two banks of memory cells. In one embodiment, the array of memory cells 30 includes four banks of memory cells. In one embodiment, the array of memory cells 30 includes eight banks of memory cells. In other embodiments, the array of memory cells 30 includes more than eight banks of memory cells.

Periphery circuitry 28 is built to support multiple banks of memory cells. Periphery circuitry 28 can be and is used in other memories, similar to memory 24. Each of the other memories has a different number of banks of memory cells. In one embodiment of a memory, periphery circuitry 28 is built to support more banks of memory cells than the number of banks of memory cells in the memory. In one embodiment of a memory, periphery circuitry 28 is electrically coupled to a subset or portion of the multiple banks of memory that it can support, and periphery circuitry 28 includes unused connections for other banks of memory cells. In one embodiment of a memory, periphery circuitry 28 is electrically coupled to all of the multiple banks of memory that it can support.

Periphery circuitry 28 is set to support a portion of the multiple banks of memory cells or all of the multiple banks of memory cells that it can support. In one embodiment, periphery circuitry 28 is set to one of a first mode to support a portion of the multiple banks of memory cells and a second mode to support all of the multiple banks of memory cells. In one embodiment, periphery circuitry 28 includes switches that are set to put the periphery circuitry 28 into a mode for supporting a selected number or portion of the multiple banks of memory cells. In one embodiment, periphery circuitry 28 includes switches that are set to put the periphery circuitry 28 into a mode for supporting all of the multiple banks of memory cells.

Using the same periphery circuitry 28 in different memories reduces design time and the time to build the memories. Periphery circuitry does not need to be re-designed for each memory and a new floor plan and layout is not needed for each memory. Also, the size of the memory is changed by just adding or subtracting one or more banks of memory cells. These benefits reduce the time to market and cost of the memory chips.

Figure 2:
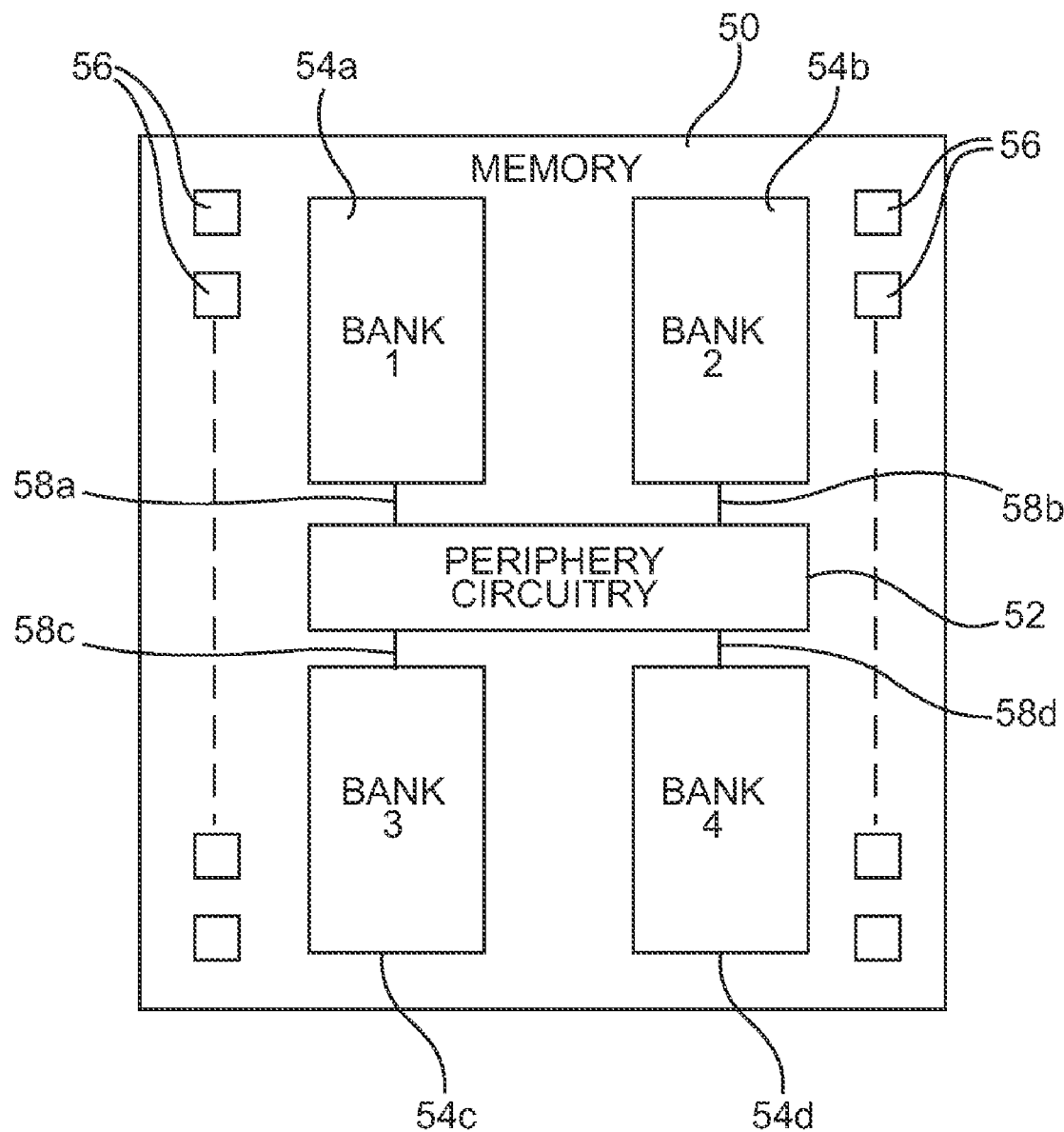
FIG. 2 is a diagram illustrating a layout block diagram of one embodiment of a memory that includes periphery circuitry, four banks of memory cells, and input/output (I/O) pads.

FIG. 2 is a diagram illustrating a layout block diagram of one embodiment of a memory 50 that includes periphery circuitry 52, four banks of memory cells 54a-54d, and input/output (I/O) pads 56. Memory 50 communicates data with a system controller, such as system controller 22 (shown in FIG. 1), to perform system functions. Memory 50 is similar to memory 24 and periphery circuitry 52 is similar to periphery circuitry 28. Also, the four banks of memory cells 54a-54d make up an array of memory cells that is similar to the array of memory cells 30.

Periphery circuitry 52 is electrically coupled to each of the four banks of memory cells 54a-54d. Periphery circuitry 52 is electrically coupled to bank 1 at 54a via bank 1 path 58a. Periphery circuitry 52 is electrically coupled to bank 2 at 54b via bank 2 path 58b. Periphery circuitry 52 is electrically coupled to bank 3 at 54c via bank 3 path 58c. Periphery circuitry 52 is electrically coupled to bank 4 at 54d via bank 4 path 58d. Periphery circuitry 52 is electrically coupled to I/O pads 56 (via paths not shown for clarity). Memory 50 includes additional address I/O pads 56 for addressing all four of the four banks of memory cells 54a-54d in memory 50.

Periphery circuitry 52 receives addresses and commands from a system controller, such as system controller 22, and provides bank signals. The four banks of memory cells 54a-54d receive bank signals via bank x paths 58a-58d to control the four banks of memory cells 54a-54d. Bank 1 at 54a receives bank signals via bank 1 path 58a, bank 2 at 54b receives bank signals via bank 2 path 58b, bank 3 at 54c receives bank signals via bank 3 path 58c, and bank 4 at 54d receives bank signals via bank 4 path 58d. Each of the four banks of memory cells 54a-54d includes memory cells, similar to memory cells 34. In one embodiment, periphery circuitry 52 includes a memory control or control logic for controlling memory 50.

Periphery circuitry 52 supports all four of the four banks of memory cells 54a-54d. Periphery circuitry 52 is set to support all four of the four banks of memory cells 54a-54d. In one embodiment, periphery circuitry 52 is set to a first or second mode to support all four of the four banks of memory cells 54a-54d. In one embodiment, periphery circuitry 52 includes switches that are set to put the periphery circuitry 52 into a mode for supporting all four of the four banks of memory cells 54a-54d.

Periphery circuitry 52 can be and is used in smaller memories that include fewer than four banks of memory cells. In these smaller memories, periphery circuitry 52 is set to support the smaller number of banks of memory cells in the memory. In one embodiment, periphery circuitry 52 is set to a first or second mode to support the smaller number of banks of memory cells. In one embodiment, periphery circuitry 52 is built to support four banks of memory cells, such as the four banks of memory cells 54a-54d, but the memory includes only two banks of memory such that periphery circuitry 52 is electrically coupled to the two banks of memory cells and includes unused connections for another two banks of memory cells. In one embodiment, periphery circuitry 52 includes switches that are set to put the periphery circuitry 52 into a mode for supporting a selected number or portion of the four banks of memory cells.

Figure 3:
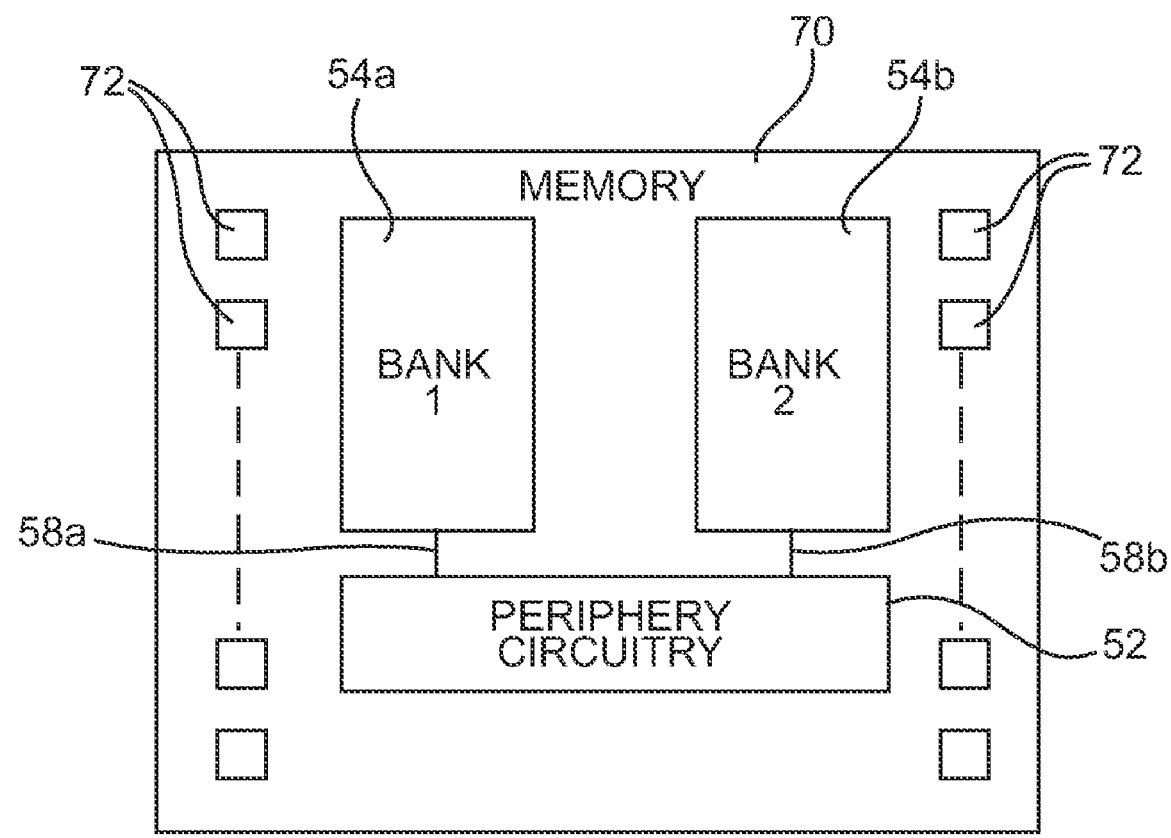
FIG. 3 is a diagram illustrating a layout block diagram of one embodiment of a memory that includes periphery circuitry, four banks of memory cells, and I/O pads.

FIG. 3 is a diagram illustrating a layout block diagram of one embodiment of a memory 70 that includes periphery circuitry 52, two banks of memory cells 54a and 54b, and I/O pads 72. Memory 70 communicates data with a system controller, such as system controller 22 (shown in FIG. 1), to perform system functions. Memory 70 is similar to memory 24. Periphery circuitry 52 is similar to periphery circuitry 28 and the two banks of memory cells 54a and 54b make up an array of memory cells that is similar to the array of memory cells 30. Also, periphery circuitry 52 shown in FIG. 3 is the same as periphery circuitry 52 shown in FIG. 2, and the two banks of memory cells 54a and 54b shown in FIG. 3 are the same as the banks of memory cells 54a and 54b shown in FIG. 2. Memory 70 is similar to memory 50 with the two banks of memory cells 54c and 54d removed.

Periphery circuitry 52 is electrically coupled to each of the two banks of memory cells 54a and 54b. Periphery circuitry 52 is electrically coupled to bank 1 at 54a via bank 1 path 58a and periphery circuitry 52 is electrically coupled to bank 2 at 54b via bank 2 path 58b. Also, periphery circuitry 52 is electrically coupled to I/O pads 72 (via paths not shown for clarity). Memory 70 includes fewer address I/O pads 72 than memory 50 for addressing two banks of memory cells 54a and 54b instead of four banks of memory cells.

Periphery circuitry 52 receives addresses and commands from a system controller, such as system controller 22, and provides bank signals. The two banks of memory cells 54a and 54b receive bank signals via bank x paths 58a and 58b to control the two banks of memory cells 54a and 54b. Bank 1 at 54a receives bank signals via bank 1 path 58a and bank 2 at 54b receives bank signals via bank 2 path 58b. Each of the two banks of memory cells 54a and 54b includes memory cells, similar to memory cells 34. In one embodiment, periphery circuitry 52 includes a memory control or control logic for controlling memory 70.

Periphery circuitry 52 is built to support four banks of memory cells, such as the four banks of memory cells 54a-54d. However, in memory 70, periphery circuitry 52 is electrically coupled to the two banks of memory cells 54a and 54b and includes unused connections for another two banks of memory cells. Also, in memory 70, periphery circuitry 52 is set to support only the two banks of memory cells 54a and 54b. In one embodiment of memory 70, periphery circuitry 52 is set to a first or second mode to support the two banks of memory cells 54a and 54b. In one embodiment of memory 70, periphery circuitry 52 includes switches that are set to put the periphery circuitry 52 into a mode for supporting the two banks of memory cells 54a and 54b.

Using the same periphery circuitry 52 in the memories 50 and 70 reduces design time and the time to build the memories 50 and 70. Periphery circuitry 52 does not need to be re-designed for each memory 50 and 70 and a new floor plan and layout is not needed for each memory 50 and 70. Also, the size of the memory is changed by just adding or subtracting one or more banks of memory cells 54. These benefits reduce the time to market and cost of the memories 50 and 70.

Figure 4:
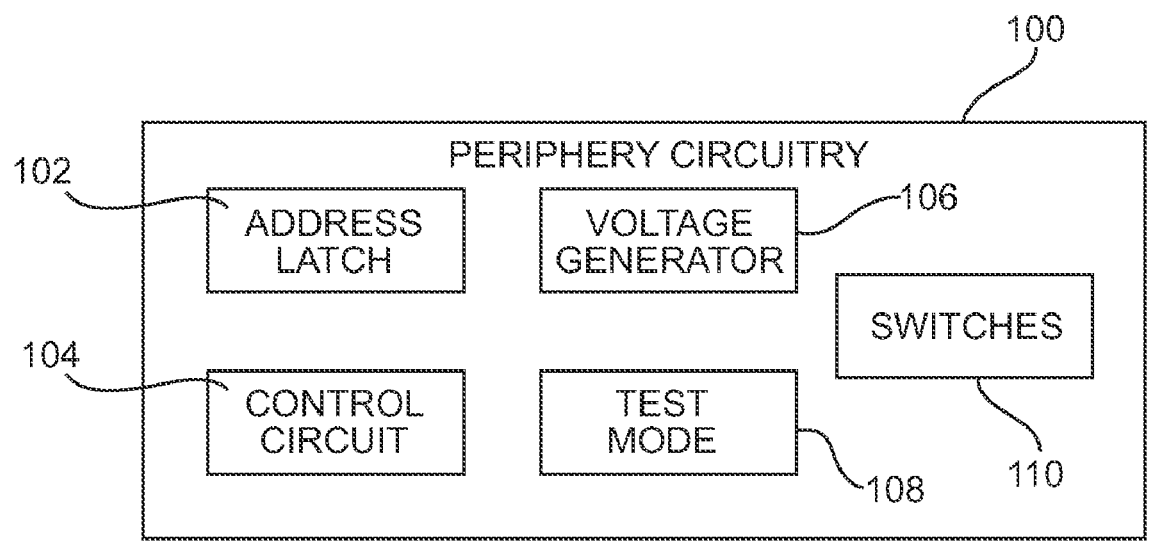
FIG. 4 is a diagram illustrating one embodiment of periphery circuitry.

FIG. 4 is a diagram illustrating one embodiment of periphery circuitry 100 that is used in a memory. Periphery circuitry 100 includes an address latch block 102, a control circuit block 104, an internal voltage generator block 106, a test mode block 108, and switches 110. Periphery circuitry 100 is built to support multiple banks of memory cells in the memory. Periphery circuitry 100 is similar to periphery circuitry 28 (shown in FIG. 1) and similar to periphery circuitry 52 (shown in FIGS. 2 and 3).

Control circuit block 104 receives commands and addresses from a system controller, such as system controller 22, and controls at least some of the periphery circuitry 100 and access to the banks of memory cells in the memory. Address latch block 102 receives addresses and latches the addresses in for executing commands, such as read and write commands. The internal voltage generator block 106 generates internal voltages for the memory, and test mode block 108 provides testing of the memory, including testing of the banks of memory cells.

Periphery circuitry 100 is built to support a number of banks of memory cells and can be used in memories to support all of the multiple banks of memory cells it is built to support or fewer than all of the multiple banks of memory cells it is built to support. In one embodiment of a memory, periphery circuitry 100 is electrically coupled to a subset or portion of the multiple banks of memory cells that it can support, and periphery circuitry 100 includes unused connections for other banks of memory cells. In one embodiment of a memory, periphery circuitry 100 is electrically coupled to all of the multiple banks of memory that it can support.

Periphery circuitry 100 is set to support either a portion of the multiple banks of memory cells or all of the multiple banks of memory cells that it can support. Switches 110 are set to put periphery circuitry 100 into a mode to support some or all of the multiple banks of memory cells. In one embodiment, switches 110 are set to put the periphery circuitry 100 into a mode for supporting a selected number or portion of the multiple banks of memory cells. In one embodiment, switches 100 are set to put the periphery circuitry 100 into a mode for supporting all of the multiple banks of memory cells that it can support. In one embodiment, switches 110 are set via a metal mask. In one embodiment, switches 110 are set via a programmable register.

Figure 5:
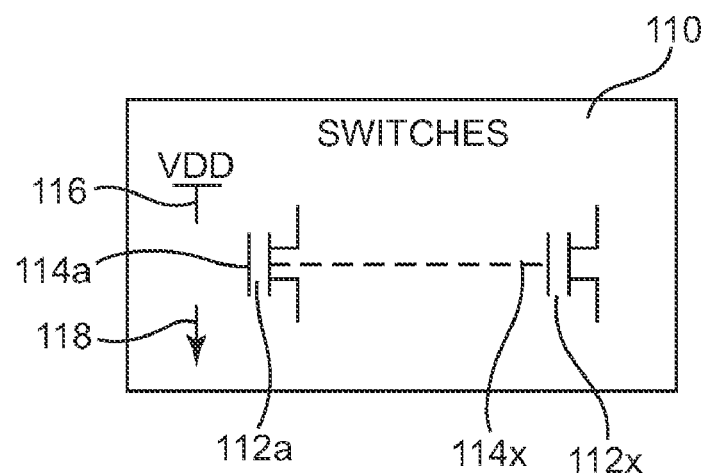
FIG. 5 is a diagram illustrating one embodiment of switches in periphery circuitry.

FIG. 5 is a diagram illustrating one embodiment of switches 110 in periphery circuitry 100. Switches 110 include metal oxide semiconductor field effect transistors (MOSFETs) 112a-112x. MOSFETs 112a-112x are set to put periphery circuitry 100 into a mode for supporting some or all of the multiple banks of memory cells. MOSFETs 112a-112x includes gates 114a-114x. In one embodiment, MOSFETs 112a-112x are set via a metal mask to short the gates 114a-114x to either power VDD at 116 or a reference voltage, such as ground, at 118. In one embodiment, MOSFETs 112a-112x are set via a programmable register. In one embodiment, switches are implemented via a metal mask, without using transistors.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
    a plurality of memory cell banks;
    periphery circuitry configured to support a maximum number of memory cell banks which is equal to or greater than the plurality of memory cell banks and comprising:
        switches that are set to put the periphery circuitry into a first mode to support the plurality of memory cell banks when the plurality of memory cell banks total fewer than the maximum number of memory cell banks and a second mode to support the plurality of memory cell banks when the plurality of memory cell banks total the maximum number of memory cell banks.

2. The memory of claim 1, wherein the plurality of memory cell banks total fewer than the maximum number of memory cell banks and the periphery circuitry includes unused connections for additional banks of memory cells.

3. The memory of claim 2, wherein the switches are set to put the periphery circuitry into the first mode to support the plurality of memory cell banks.

4. The memory of claim 1, wherein the plurality of memory cell banks total the maximum number of memory cell banks.

5. The memory of claim 4, wherein the switches are set to put the periphery circuitry into the second mode.

6. The memory of claim 4, comprising additional address input pads for addressing the plurality of memory cell banks.

7. The memory of claim 1, wherein the switches are set via a metal mask.

8. The memory of claim 1, wherein the switches are set via a programmable register.

9. The memory of claim 1, wherein the plurality of memory cell banks include DRAM memory cells.

10. An integrated circuit comprising:
    a first bank of memory cells;

a second bank of memory cells; and periphery circuitry configured to support a maximum number of memory cell banks which is more than two banks of memory cells, wherein the periphery circuitry includes switches that are set to put the periphery circuitry into a first mode for supporting only the first bank of memory cells and the second bank of memory cells and set to put the periphery circuitry into a second mode for supporting the maximum number of memory cell banks.

11. The integrated circuit of claim 10, wherein the periphery circuitry is connected to the first bank of memory cells and the second bank of memory cells and includes unused connections for other banks of memory cells.

12. The integrated circuit of claim 10, comprising:
a third bank of memory cells; and
a fourth bank of memory cells, wherein the periphery circuit is coupled to the third bank of memory cells and the fourth bank of memory cells.

13. The integrated circuit of claim 10, wherein the integrated circuit is a PSRAM.

14. The integrated circuit of claim 10, wherein the integrated circuit is a CellularRAM.

15. A memory comprising:
a plurality of memory cell banks;
means for supporting a maximum number of memory cell banks which is equal to or greater than the plurality of memory cell banks; and
means for setting the means for supporting into a first mode to support the plurality of memory cell banks when the plurality of memory cell banks total fewer than the maximum number of memory cell banks and into a second mode to support the plurality of memory cell banks when the plurality of memory cell banks total the maximum number of memory cell banks.

16. The memory of claim 15, wherein the means for supporting is coupled to a first bank of memory cells and a second bank of memory cells and comprises:
means for coupling to other banks of memory cells.

17. The memory of claim 16, wherein the means for setting is set to put the means for supporting into the first mode for only supporting the first bank of memory cells and the second bank of memory cells.

18. The memory of claim 15, wherein the means for supporting is coupled to a first bank of memory cells, a second bank of memory cells, a third bank of memory cells and a fourth bank of memory cells and comprises:
means for coupling to other banks of memory cells.

19. A method of operating a memory including a plurality of memory cell banks, comprising:
supporting the plurality of memory cell banks via periphery circuitry configured to support a maximum number of memory cell banks which is equal to or greater than the plurality of memory cell banks; and
setting switches to put the periphery circuitry into one of a first mode to support the plurality of memory cell banks when the plurality of memory cell banks total fewer than the maximum number of memory cell banks and a second mode to support the plurality of memory cell banks when the plurality of memory cell banks total the maximum number of memory cell banks.

20. The method of claim 19,
wherein the plurality of memory cell banks total fewer than the maximum number of memory cell banks, the switches are set to put the periphery circuitry into the first mode and the periphery circuitry includes unused connections for additional banks of memory cells.

21. The method of claim 20, comprising:
setting the switches to put the periphery circuitry into the first mode.

22. The method of claim 19,
wherein the plurality of memory cell banks total the maximum number of memory cell banks and the switches are set to put the periphery circuitry into the second mode.

23. A method of operating a memory including a first bank of memory cells and a second bank of memory cells, the method comprising:
supporting the first bank of memory cells and the second bank of memory cells via periphery circuitry configured to support a maximum number of memory cell banks which is more than two banks of memory cells; and
setting switches that put the periphery circuitry into one of a first mode for supporting only the first bank of memory cells and the second bank of memory cells and a second mode for supporting the maximum number of memory cell banks.

24. The method of claim 23, comprising:
setting the switches to put the periphery circuitry into the first mode.

25. The method of claim 23,
wherein the memory further includes a third bank of memory cells and a fourth bank of memory cells; and
setting the switches to put the periphery circuitry into the second mode.

* * * * *